United States Patent [19]

Takeuchi et al.

[11] Patent Number: 5,154,339
[45] Date of Patent: Oct. 13, 1992

[54] FRAME RETAINER MOUNT USED IN BONDING MACHINES

[75] Inventors: Takashi Takeuchi; Takeyuki Nakagawa, both of Tokyo, Japan

[73] Assignee: Kabushiki Kaisha Shinkawa, Tokyo, Japan

[21] Appl. No.: 842,263

[22] Filed: Feb. 27, 1992

[30] Foreign Application Priority Data

Feb. 27, 1991 [JP] Japan ..................... 3-053699

[51] Int. Cl.[5] ........................... B23K 37/04
[52] U.S. Cl. ..................... 228/47; 228/4.5; 269/903
[58] Field of Search ............. 228/179, 180.2, 4.5, 228/44.7, 47, 904; 269/903; 219/158, 161

[56] References Cited

U.S. PATENT DOCUMENTS 5,035,034  7/1991  Cotney .................... 228/4.5

FOREIGN PATENT DOCUMENTS 47-45470  12/1972  Japan .

Primary Examiner—Samuel M. Heinrich
Attorney, Agent, or Firm—Koda and Androlia

[57] ABSTRACT

In a lead frame retainer mount used in, for example, wire bonding machines, tapered edges are formed on opposite ends of a frame retainer, and a frame retainer carrier which carries the frame retainer and tapered sections which engage with one of the tapered edges of the frame retainer are formed in the frame retainer holder. In addition, a fastening assembly which fastens the frame retainer to the frame retainer holder includes a handle mounted on the frame retainer holder and a clamp which is raised and lowered by a spring when the handle is turned so as to press against the other tapered edge of the frame retainer. Thus, replacement of the frame retainer can be accomplished very easily and in a short amount of time.

2 Claims, 2 Drawing Sheets

5,154,339

FRAME RETAINER MOUNT USED IN BONDING MACHINES

BACKGROUND OF THE INVENTION

1. Field of the Invention

The present invention relates to a frame mount for bonding machines which presses and positionally fixes frames such as lead frames against a carrying surface of a bonding station during wire bonding or die bonding process.

2. Prior Art

In bonding machines, bonding is performed with a frame on a heater block pressed down by a frame retainer. It is, therefore, necessary to use a frame retainer which has a bonding window and retaining section suited to each type of frame to be handled.

In a conventional frame retainer mount, the frame retainer is directly mounted to a frame retainer holder via screws. One example of a frame retainer mount of this type is disclosed in Japanese Patent Application Laid-Open ("Kokai") No. 47-45470.

In this prior art, the frame retainer is mounted directly to a frame retainer holder by means of a plurality of screws. Thus, when the type of lead frame to be handled is changed, it is necessary to loosen the screws with a screw driver to dismount the frame retainer and mount another frame retainer. This is extremely troublesome and requires a considerable amount of time.

SUMMARY OF THE INVENTION

The object of the present invention is to provide a frame retainer mount in which a change of the frame retainer is accomplished very easily and in a very short period of time.

The above described object of the present invention is accomplished by a unique structure of a frame retainer mount which includes: a heater block, a frame retainer holder which is installed above the heater block, a frame retainer which is positioned and retained in the frame retainer holder, and a mounting means which secures the frame retainer onto the frame retainer holder, and in this frame retainer mount:

the frame retainer is provided with tapered edges on opposite end surfaces, the frame retainer holder is provided with a frame retainer carrier that receives the frame retainer, the frame retainer holder further being formed with a tapered section which engages with one of the tapered edges of the frame retainer, and the mounting means includes a frame retaining assembly which has a screw means mounted to the frame retainer holder and a clamp raised and lowered by a spring when screw means is turned by via a handle so as to press against the other tapered edge of the frame retainer When the handle is turned and the clamp is lowered, one of the tapered edge of the frame retainer is pushed by the clamp and the frame retainer moves toward the tapered section of the frame retainer holder. As a result, the tapered edge of the frame retainer is engaged with the corresponding tapered section of the frame retainer holder. The frame retainer is thus positioned and held by the frame retainer holder. When the handle is turned to raise the clamp, the frame retainer is released.

BRIEF DESCRIPTION OF THE INVENTION

DETAILED DESCRIPTION OF THE INVENTION

One embodiment of the present invention will be described below with reference to the accompanying drawings.

Figure 1:
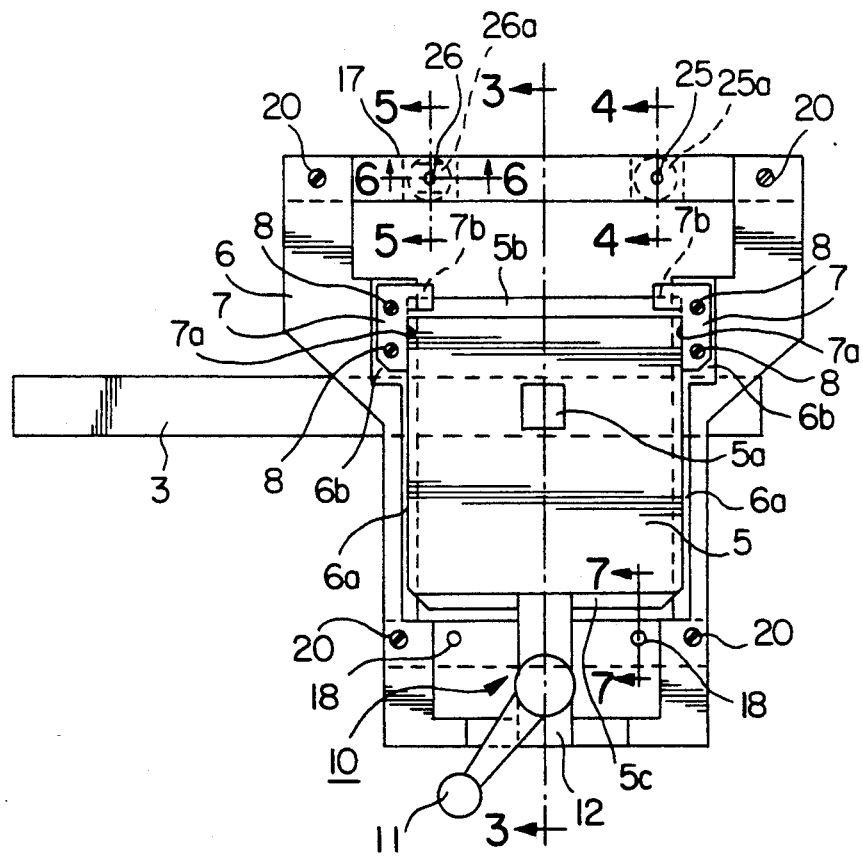
FIG. 1 is a top view of a frame retainer mount representing one embodiment of the present invention.
Figure 2:
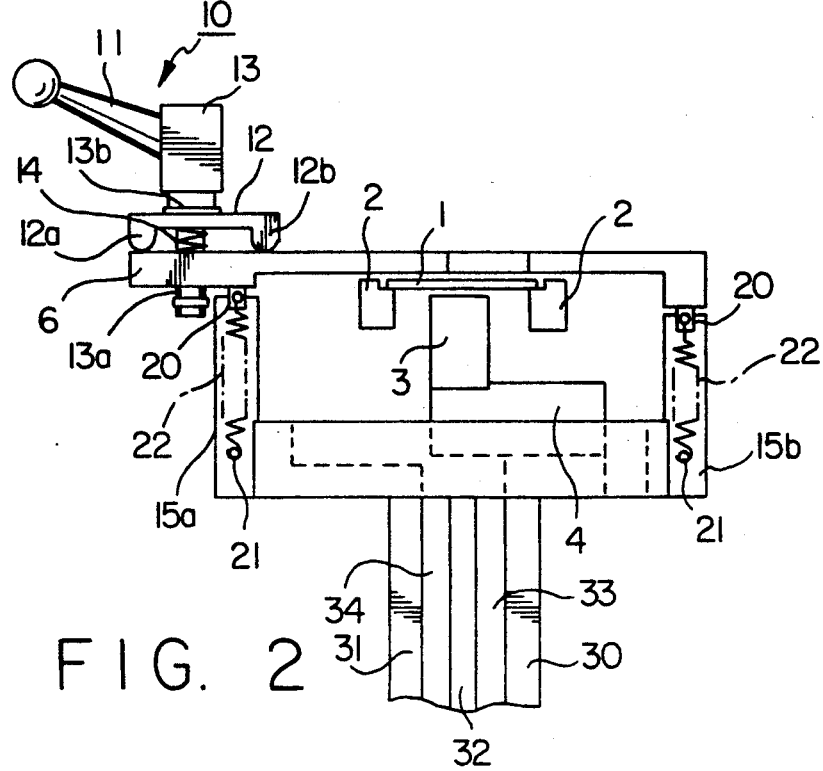
FIG. 2 is a right side view thereof.
Figure 3:
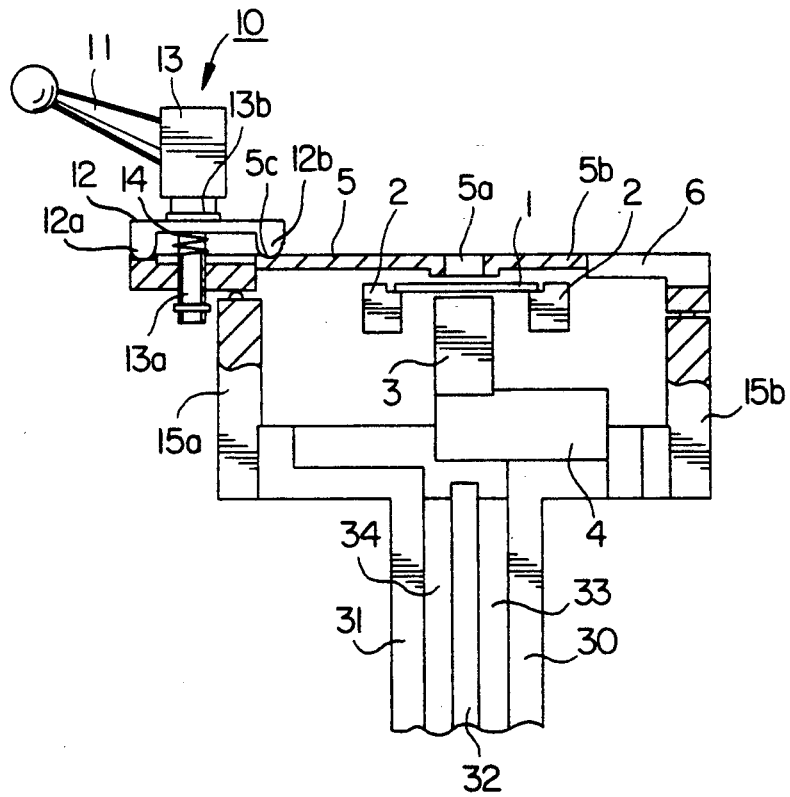
FIG. 3 is a cross section taken along the line 3—3 in FIG. 1.

As shown in FIGS. 1 through 3, a heater block 3 is installed between guide rails 2 which guide a lead frame 1. The heater block 3 is fastened to a heater block supporting plate 4.

A frame retainer 5 which presses the lead frame 1 against the upper surface of the heater block 3 (or against the carrying surface of the bonding station) is installed above the heater block 3 in a bonding station. The frame retainer 5 is rectangular and has a bonding window 5a located above the heater block 3. Tapered edges 5b and 5c which incline outward from the upper surface (or face upward) are formed on opposite end surfaces of the frame retainer 5.

The frame retainer 5 is positioned and retained in a frame retainer holder 6 which has an open space inside. Frame retainer carrier 6a and positioning section 6b are formed on the frame retainer holder 6 so that they are on the same plane (or the same in height). The frame retainer carriers 6a retains the frame retainer 6 on its two inside surfaces.

The positioning sections 6b has L-shaped positioning plates 7 mounted thereon by means of screws 8. The positioning plates 7 position the left and right sides of the frame retainer 5 at the end where the tapered edge 5b is located. Each positioning plate 7 has a positioning section 7a and a tapered section 7b. The positioning section 7a positions the side surfaces of the frame retainer 5. The tapered section 7b is provided in the same direction as the tapered edge 5b of the frame retainer 5 in areas that correspond to the tapered edge 5b.

The frame retainer holder 6 has a frame retaining assembly 10 on the side which is the same as the tapered edge 5c is provided on the frame retainer 5. The frame retaining assembly 10 includes a screwing means 13, that has a handle 11, and a clamp 12. The clamp 12 fits over the screw 13a of the screwing means 13, and the screw 13a is screwed into the frame retainer holder 6. A spring 14 is installed on the screw 13a between the frame retainer holder 6 and the clamp 12. The clamp 12 is biased upward by this spring 14.

Figure 4:
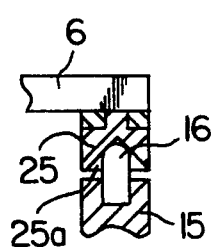
FIG. 4 is an enlarged cross section taken along the line 4—4 in FIG. 1.

The frame retainer holder 6 is carried on the upper surface of holder supporting plates 15a and 15b. As shown in FIG. 4, a bridge piece 25 is fastened to the undersurface of the frame retainer holder 6. The bridge piece 25 is on the supporting plate 15b, which is opposite from the frame retaining assembly 10, so that the frame retainer holder 6 is positioned at a prescribed position on the holder supporting plate 15. A reference hole 25a of a reversed cone shape is formed in the bridge piece 25.

Figure 6:
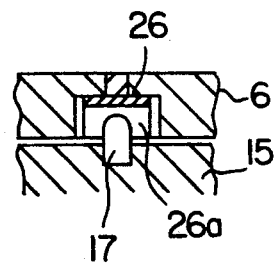
FIG. 6 is an enlarged cross section taken along the line 6—6 in FIG. 1.
Figure 5:
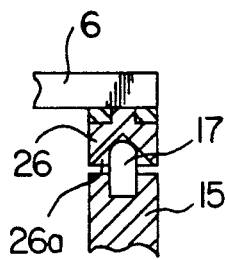
FIG. 5 is an enlarged cross section taken along the line 5—5 in FIG. 1.

Furthermore, as shown in FIGS. 5 and 6, a bridge piece 26 is also fastened to the undersurface of the frame retainer holder 6. The bridge piece 26 is on the supporting plate 15b (which is opposite from the frame retaining assembly 10). A V-shaped groove 26a is formed in the bridge piece 26. The groove 26a extends in the direction parallel to the guide rails 2.

The holder supporting plate 15b has a reference pin 16 and a rotation-checking pin 17. The reference pin 16 fits into the reference hole 25a, and the rotation-checking pin 17 fits into the groove 26a.

Figure 7:
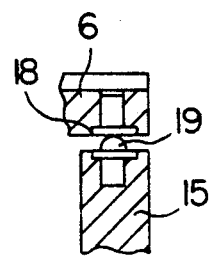
FIG. 7 is an enlarged cross section taken along the line 7—7 in FIG. 1.

As shown in FIG. 7, a receiving pin 18 is fastened to the undersurface of the frame retainer holder 6. The receiving pins 18 are on the supporting plate 15a which is on the same side as the frame retaining assembly 10 is provided. Supporting pin 19 which supports the receiving pin 18 is fastened to the upper surface of the holder supporting plate 15a. As seen from FIG. 1, the pins 18 and 19 are provided in a pair.

The frame retainer holder 6 has at the four corners screw holes for respective spring attachments 20 (see FIG. 1). Other spring attachments 21 are provided at the lower portions of the holder supporting plates 15a and 15b so that they positionally correspond to the spring attachments 20 of the frame retainer holder 6 (see FIG. 2). Springs 22 are provided between the corresponding spring attachments 20 and 21. With the springs 22, the frame retainer holder 6 is biased in a direction that the holder 6 is pulled towards the holder supporting plates 15a and 15b.

The heater block supporting plate 4 and holder supporting plates 15a and 15b are respectively mounted on vertically moving blocks 30 and 31. The moving blocks 30 and 31 are independently driven up and down by a driving means (not shown). Also, these vertically moving blocks 30 and 31 are supported so that they are free to move up and down along the fixed part 32 of the bonding machine via linear guides 33 and 34.

The operation of the embodiment will be described below in which a change of the frame retainer 5 is necessary when the type of lead frame to be handled is changed.

When the handle 11 is turned in the direction that the clamp 12 is loosened from the state illustrated in the drawing, the clamp 12 is moved upwardly by the spring 14. As a result, the pressing force of the clamp 12 against the frame retainer 5 is released. Then, the clamp 12 is rotated approximately 90 degrees by hand, and the frame retainer 5 is removed. The tapered edge 5c of a new or replaced frame retainer 5 is aligned with the tapered sections 7b of the positioning plates 7, and the new frame retainer 5 is carried on the frame retainer carrier 6a of the frame retainer holder 6. As a result, the frame retainer 5 is positioned with respect to the left and right directions by the frame positioning plates 7.

Next, the clamp 12 is rotated back approximately 90 degrees so that the clamp 12 is returned to its original position and the clamp leg 12b of the clamp 12 is positioned above the tapered edge 5c of the frame retainer 5.

Then, when the handle 11 is turned in the direction which tightens the clamp 12, the clamp 12 is pushed downward by the shoulder 13b of the screwing means 13. This results in that the clamp leg 12a of the clamp 12 comes into contact with the frame retainer holder 6 and the clamp leg 12b of the clamp 12 contacts the tapered edge 5c of the frame retainer 5.

Afterward, the clamp leg 12b of the clamp 12 rotates about the supporting point 12a and presses against the tapered edge 5c of the frame retainer 5. As a result, the tapered edge 5b of the frame retainer 5 is pressed against the tapered sections 7b of the positioning plates 7, and the frame retainer 5 is positioned with respect to the forward and backward directions and held.

As described above, since mounting and dismounting of the frame retainer 5 is accomplished merely by turning the handle 11, replacement of the frame retainer 5 is extremely easy and requires only a very short time.

Next, the frame retainer 5 that presses the lead frame 1 will be described.

The drawings show the lead frame 1 pressed against the heater block 3 by the frame retainer 5. With the frame retainer 5 positioned raised and the heater block 3 lowered, the lead frame 1 is fed by a feeding mechanism (not shown) so that the bonding part of the lead frame 1 is positioned in the bonding window 5a of the frame retainer 5.

The vertically moving block 30 is raised by a driving means (not shown) so that the heater block 3 comes into contact with the lead frame 1. Then, the vertically moving block 31 is lowered so that the frame retainer 5 contacts the lead frame 1. The vertically moving block 31 is lowered even further.

In this case, the frame retainer 5 cannot be lowered any further, since it is in contact with the lead frame 1; however, the holder supporting plate 15 is lowered overcoming the force of the springs 22, thus creating a gap between the frame retainer holder 6 and the holder supporting plate 15. As a result, the frame retainer 5 presses the lead frame 1 against the heater block 3 by means of the driving force of the springs 22 and the wire bonding or die bonding is performed in this state.

After the bonding action, the vertically moving block 30, i. e., the heater block 3, is lowered, and the vertically moving block 31 is raised. When the vertically moving block 31 is raised, the supporting pins 19 comes into contact with the receiving pins 18, and the reference pin 16 and rotation-checking pin 17 respectively contact the reference hole 25a and rotation-checking groove 26a.

In other words, the frame retainer holder 6 is positioned in a prescribed position with respect to the holder supporting plate 15 by not only the reference hole 25a and reference pin 16 but also by the rotation-checking groove 26a and rotation-checking pin 17.

When the vertically moving block 31 is raised even further, the frame retainer holder 6 is raised along with the vertically moving block 31. Under this position, the lead frame 1 is fed by one pitch so that the bonding part that is to be bonded next is positioned in the bonding window 5a of the frame retainer 5.

In the embodiment described above, the heater block 3 and frame retainer 5 are both raised and lowered together. However, it goes without saying that the present invention can be applied to a device in which only one of these two parts is raised and lowered.

Furthermore, in the embodiment described above, the frame retainer holder 6 and holder supporting plate 15 are separate parts, and the frame retainer holder 6 is pressed against the holder supporting plate 15 by springs 22. Naturally, however, the present invention can be applied to an apparatus in which the frame retainer holder 6 and holder supporting plate 15 are designed as a single, integral unit.

In addition, in the described embodiment, the positioning of the frame retainer 5 with respect to the left and right directions is accomplished by the positioning plates 7. However, it is also possible to accomplish this left-right positioning by installing pins on either the frame retainer 5 or the frame retainer holder 6, by forming grooves in the other of these two parts 5 and 6, and by inserting the pins into the grooves.

As described above, according to the present invention, mounting and dismounting of the frame retainer are accomplished merely by turning the handle. Accordingly, replacement of the frame retainer is extremely easy and is accomplished in a short period of time.

We claim:

1. A frame retainer mount comprising: a heater block, a frame retainer holder which is installed above said heater block, a frame retainer which is positioned and held in said frame retainer holder, and a mounting means which secures said frame retainer onto said frame retainer holder, wherein said frame retainer mount is characterized in that:

tapered edges are formed on opposite end surfaces of said frame retainer, a frame retainer carrier that holds said frame retainer is provided on said frame retainer holder, said frame retainer holder being formed with a tapered section which engages with one of said two tapered edges of said frame retainer, and said mounting means includes a frame retaining assembly which has a handle and a clamp, said handle being mounted on said frame retainer holder and said clamp being raised and lowered by means of a spring force when said handle is turned and pressing against said other tapered section of said frame retainer.

2. A frame retainer mount comprising: a heater block, a frame retainer holder installed above said heater block, a frame retainer positioned and held in said frame retainer holder, and a mounting means which secures said frame retainer onto said frame retainer holder, wherein said frame retainer mount is characterized in that:

said frame retainer is provided with tapered edges at both ends;

said frame retainer holder is provided with a frame retainer carrier that holds said frame retainer and with a tapered section which engages with one of said two tapered edges of said frame retainer, and said mounting means comprises a screw means mounted on said frame retainer holder and a clamp which is raised and lowered via a spring force when said screw means is turned, said clamp pressing against another one of said tapered edges of said frame retainer.

* * * * *